(12) United States Patent
Audy et al.

(10) Patent No.: US 6,961,396 B2
(45) Date of Patent: Nov. 1, 2005

(54) DIGITAL BANKING CIRCUIT

(75) Inventors: Jonathan M. Audy, Los Gatos, CA (US); Gabor Reizik, Dublin, CA (US); Richard Redl, Farvagny-le-Petit (CH); Brian P. Erisman, Carlsbad, CA (US)

(73) Assignee: Analog Devices, Inc., Norwood, MA (US)

( * ) Notice: Subject to any disclaimer, the term of this patent is extended or adjusted under 35 U.S.C. 154(b) by 688 days.

(21) Appl. No.: 09/770,543

(22) Filed: Jan. 26, 2001

(65) Prior Publication Data

US 2002/0101945 A1 Aug. 1, 2002

(51) Int. Cl.[7] .................................................. H04B 1/10
(52) U.S. Cl. ...................................... 375/351; 455/223
(58) Field of Search ................................ 375/328, 351; 341/70; 327/379, 387; 455/223

(56) References Cited

U.S. PATENT DOCUMENTS

| 4,521,917 A | * | 6/1985 | Holt, Jr. ..................... 455/223 |
| 5,418,410 A | * | 5/1995 | Tisinger ...................... 327/77 |
| 5,463,662 A | * | 10/1995 | Sutterlin et al. ............ 375/351 |
| 5,801,651 A | * | 9/1998 | Nehoda ....................... 341/70 |

* cited by examiner

*Primary Examiner*—Phuong Phu
(74) *Attorney, Agent, or Firm*—Koppel, Jacobs, Patrick & Heybl

(57) ABSTRACT

A digital blanking circuit allows a first digital input signal transition to be passed on to a following stage, but prohibits the passing of subsequent transitions for a predetermined blanking interval. One embodiment of the present invention employs rising edge and falling edge latches, the inputs of which receive the digital input signal and the outputs of which are connected to a two-to-one multiplexer. The mux output is connected to a blanking interval circuit, which is triggered to begin timing a blanking interval by a multiplexer output transition. The blanking interval circuit provides outputs which control the latches and selects the latch output to be transferred to the multiplexer output such that the multiplexer output is prevented from transitioning during a blanking interval. An "adaptive" blanking circuit is also described in which the blanking interval is terminated when the transition which triggered the start of the blanking interval propagates through an entire signal path, such that the blanking interval is automatically adjusted to be the same as the signal path delay.

10 Claims, 5 Drawing Sheets

DIGITAL BANKING CIRCUIT

BACKGROUND OF THE INVENTION

1. Field of the Invention

This invention relates to the field of blanking circuits, and particularly to blanking circuits for use with digital input signals.

2. Description of the Related Art

Many electronic circuits provide digital signals to following stages, which act in response to them. In some instances there can be noise on the digital signal; for example, the output of a comparator may contain noise if its inputs are noisy. This noise can cause unexpected and erratic behavior in a following stage that is switched by the comparator output.

When the digital signal is produced by a comparator, input-referred hysteresis is often employed to prevent noisy inputs from affecting the output. However, in the presence of a large amount of switching noise, the hysteresis needed may be so large as to significantly affect the magnitude of the input voltage swings, and hence the overall circuit performance.

A circuit is needed that can prevent noise found in a digital signal from being propagated to a following stage, without unduly affecting the overall performance of the circuit.

SUMMARY OF THE INVENTION

A digital blanking circuit is presented which overcomes the problems described above, preventing noise that occurs following a digital signal transition from being propagated to a following stage.

The digital blanking circuit operates by allowing a first transition of a digital input signal to be passed on to a following stage, but prohibits the passing of subsequent transitions for a predetermined blanking interval. One embodiment of the present invention employs a rising edge latch and a falling edge latch, the inputs of which receive the digital input signal and the outputs of which are connected to a two-to-one multiplexer. The output of the multiplexer is connected to a blanking interval circuit, which is triggered to begin timing a blanking interval by a multiplexer output transition. The blanking interval circuit provides outputs which control the latches and selects the latch output to be transferred to the multiplexer output such that the multiplexer output (which serves as the blanking circuit output) is prevented from transitioning during a blanking interval.

An "adaptive" blanking circuit is also described in which the digital blanking circuit is connected to the output of the last circuit in the signal path through which the digital input signal propagates. The blanking interval is terminated when the transition which triggered the start of the timing interval propagates through the entire signal path. In this way, the blanking interval is automatically adjusted to be the same as the signal path delay.

Further features and advantages of the invention will be apparent to those skilled in the art from the following detailed description, taken together with the accompanying drawings.

DETAILED DESCRIPTION OF THE INVENTION

Figure 1:
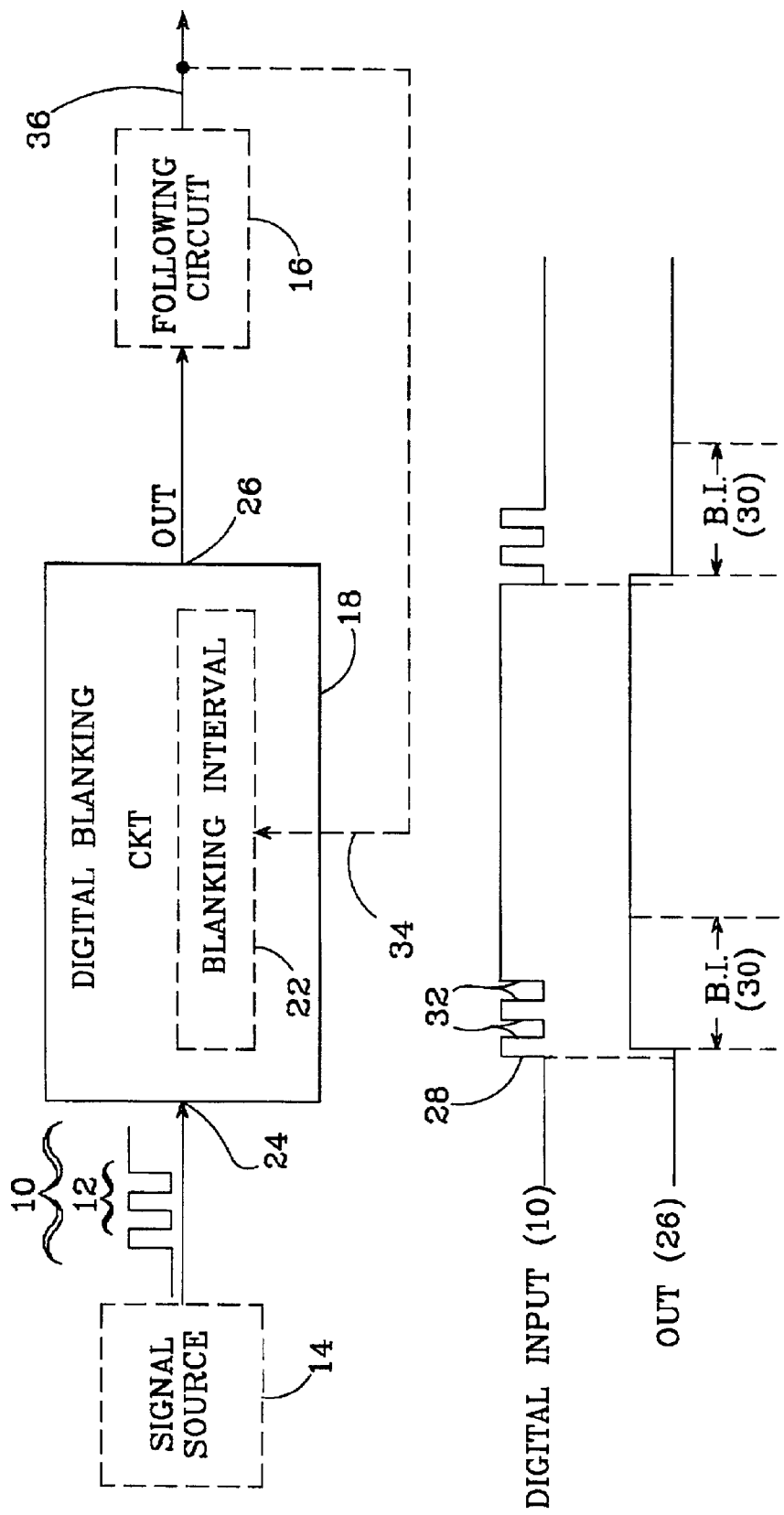
FIG. 1 is a block diagram illustrating the basic principles of the invention.

The basic principles of a digital blanking circuit in accordance with the present invention are illustrated in FIG. 1. A digital input signal 10, which may exhibit noise 12 after a low-to-high or high-to-low transition, is produced by circuitry 14 such as a comparator. Signal 10 is used to affect the actions of a following circuit 16, which may behave erratically in the presence of noise 12.

To prevent noise from reaching following circuit 16, a digital blanking circuit 18 is interposed between the digital input signal source 14 and following circuit 16; the circuit receives digital input signal 10 at an input 24 and produces an output 26 to following circuit 16. Digital blanking circuit 18 includes a blanking interval circuit 22, which is triggered to begin timing a predetermined "blanking interval" upon the occurrence of a transition of digital input signal 10. The digital blanking circuit is arranged such that its output 26 is prevented from transitioning during a blanking interval, and tracks the digital input signal otherwise—i.e., when outside of a blanking interval.

The operation of digital blanking circuit 18 is shown in the FIG. 1 timing diagram. When a transition 28 occurs on digital input signal 10, it is passed on to output 26, and a blanking interval (B.I.) 30 of a predetermined duration it triggered. Transition 28 occurs immediately prior to blanking interval 30 (and thus outside of a blanking interval); therefore, output 26 is tracking input 10 when transition 28 occurs, and thus transition 28 is passed on to output 26. During the pendency of blanking interval 30, output 26 is prevented from re-transitioning. Thus, the transitions 32 that occur after initial transition 28, but during blanking interval 30, are prevented from appearing at output 26. In this way, digital blanking circuit 18 filters out noise and other undesired transitions which might otherwise cause erratic behavior in following circuit 16.

Blanking interval circuit 22 can be arranged to provide a blanking interval having one duration for a low-to-high transition of input signal 10 (i.e., for a "rising edge"), and a second duration for a high-to-low transition ("falling edge"), with the two durations being equal or different as desired.

Alternatively, digital blanking circuit 18 can include an "adaptive input" 34, which enables a blanking interval to be adjusted for the propagation delay of a signal path followed by digital input signal 10. For example, in FIG. 1, a signal path for digital input signal 10 might consist of digital blanking circuit 18 and following circuit 16, with the following circuit producing an output 36 which varies with the output 26 of digital blanking circuit 18 (and thus with digital input signal 10). Adaptive input 34 is connected to following circuit output 36. Blanking interval circuit 22 is arranged to trigger the start of a blanking interval in the manner described above, but to terminate the blanking interval only when the signal applied to adaptive input 34 changes state—which does not occur until the transition which triggered the currently-running blanking interval propagates to output 36. In this way, the blanking interval is automatically adjusted to be the same as the signal path delay. Blanking interval circuit 22 can be arranged to terminate the blanking interval upon receipt of a rising edge, a falling edge, or either a rising or a falling edge at adaptive input 34.

The proper duration of the blanking interval is application-specific. For example, many following circuits specify a minimum width for pulses they receive as inputs. Setting the duration of the blanking interval to this minimum width ensures that the specification is met. Attention should also be paid to how long noise persists after a transition, to ensure that the blanking interval has a duration sufficient to prevent any of the noise from being propagated.

For proper operation, the time lag between the blanking interval circuit's receipt of a digital input signal transition and the start of a blanking interval should be shorter than the bandwidth of the digital input signal transitions. That is, the blanking interval circuit must be fast enough to trigger a blanking interval between the first and second transitions of digital input signal 10 when it is toggling at its maximum frequency, so that only the first transition is permitted to propagate to a following circuit.

Figure 2:
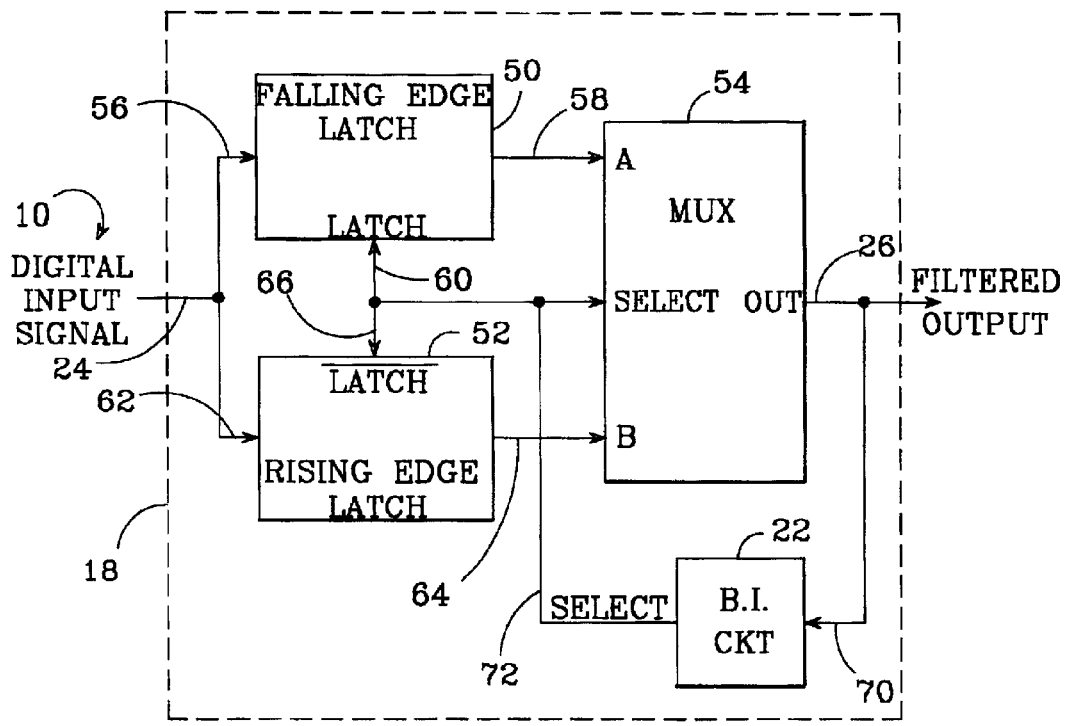
FIG. 2 is a block diagram of one embodiment of a digital blanking circuit per the present invention.

One embodiment of digital blanking circuit 18 is shown in FIG. 2. Along with blanking interval (B.I.) circuit 22, digital blanking circuit 18 includes a falling edge latch 50, a rising edge latch 52, and a two-to-one multiplexer 54. Falling edge latch 50 has an input 56, an output 58, and a LATCH input 60; a "0" is latched when LATCH is high, while output 58 tracks input 56 when LATCH is low. Rising edge latch 52 has an input 62, an output 64, and a $\overline{\text{LATCH}}$ input 66; a "1" is latched when $\overline{\text{LATCH}}$ is low, and output 64 tracks input 62 when $\overline{\text{LATCH}}$ is high. Latch inputs 56 and 62 are each connected to digital blanking circuit input 24 and receive digital input signal 10. Multiplexer 54 has inputs A and B, an output (26, which serves as the output of the digital blanking circuit), and a SELECT input; input A is passed on to mux output 26 when SELECT is high, and input B is passed on to output 26 when SELECT is low. Multiplexer output 26, labeled FILTERED OUTPUT in FIG. 2, would normally be connected to a following stage (not shown).

Blanking interval circuit 22 is connected to receive the output 26 of multiplexer 54 at an input 70, and to produce a SELECT signal 72 which is connected to the LATCH and $\overline{\text{LATCH}}$ inputs 60 and 66, and to the SELECT input of multiplexer 54.

Figure 3:
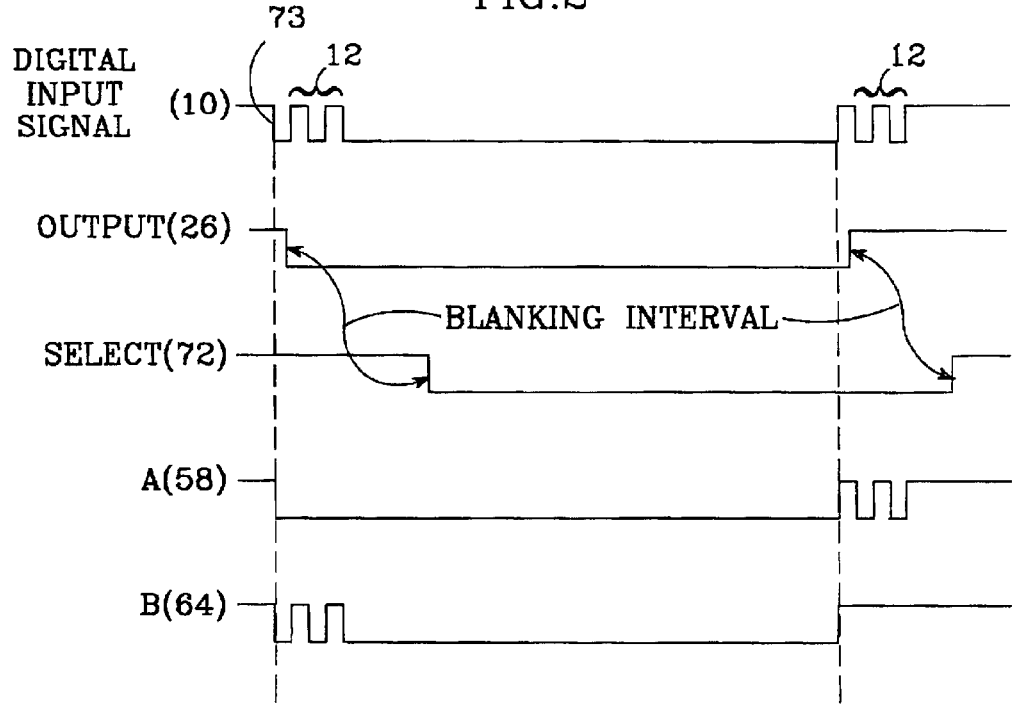
FIG. 3 is an exemplary timing diagram for the digital blanking circuit of FIG. 2.

The operation of the digital blanking circuit of FIG. 2 is illustrated with reference to the timing diagram in FIG. 3. Digital input signal 10 includes noise 12 which occurs after either high-to-low or low-to-high transitions. Initially, SELECT signal 72 is high, so that falling edge latch 50 is enabled to latch the next occurrence of a "0", the output 64 of rising edge latch 52 tracks its input 62, and multiplexer 54 passes input A, i.e., the output 58 of falling edge latch 50, to its output 26. Thus, when a high-to-low transition 73 occurs on signal 10, it is latched by falling edge latch 50, with falling edge 73 and the latched "0" passed on to output 26 via multiplexer 54.

As long as SELECT remains high, multiplexer output 26 and FILTERED OUTPUT will remain low, and thus the noise 12 present on signal 10 after transition 73 is prevented from propagating to a following stage. The amount of time that SELECT remains high after the occurrence of transition 73 is the blanking interval, which is established by blanking interval circuit 22. A transition at its input 70 triggers blanking interval circuit 22 to begin timing a blanking interval.

At the expiration of the blanking interval, blanking interval circuit 22 toggles the SELECT signal low. This enables rising edge latch 52 to latch a "1" on the next low-to-high transition of digital input signal 10, and causes multiplexer 54 to pass rising edge latch output 64 to the FILTERED OUTPUT. When the latched "1" is received by blanking interval circuit 22, it triggers a new blanking interval. Output 64 remains selected during the blanking interval, thereby keeping the noise 12 present on signal 10 after its low-to-high transition from propagating to a following stage. In this way, the noise found on digital input signal 10 after either a low-to-high or a high-to-low transition is prevented from being propagated to following stages.

Figure 4:
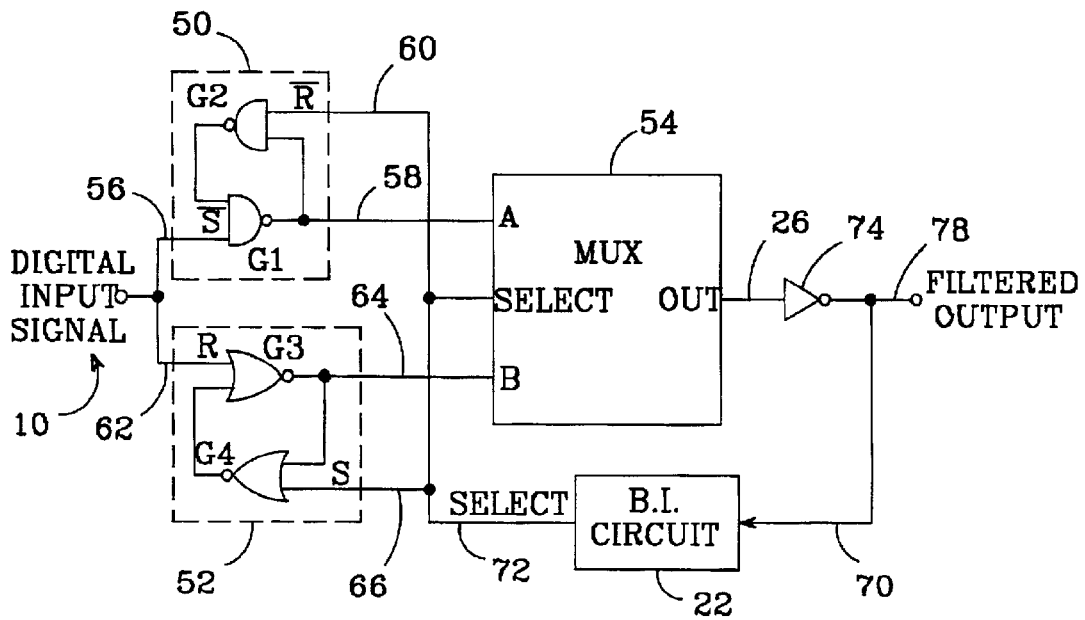
FIG. 4 is a diagram of another embodiment of a digital blanking circuit per the present invention.

An advantage of the FIG. 2 arrangement is that the latching is done locally within the rising and falling edge latches themselves, providing very high speed edge latching which does not depend on the response time of the multiplexer or blanking interval circuit. Also, signal propagation through the digital blanking circuit is kept relatively short; the signal path includes one gate (for a typical latch implementation as is shown in FIG. 4, below) and one multiplexer which is already "pre-selected"; i.e., with the appropriate latch output selected by the multiplexer before the occurrence of a transition. This pre-selection is an inherent consequence of the circuit arrangement, in which the multiplexer alternately selects the outputs of the falling and rising edge latches as digital input signal 10 toggles low and high.

Blanking interval circuit 22 can be arranged to provide blanking intervals of equal duration for either rising or falling edges, or can be arranged to provide blanking intervals of different durations for rising and falling edges. To attain a filtered output of the type depicted in FIG. 3, the blanking intervals must last at least as long as the noise that follows a transition. For example, if a particular digital input signal exhibits noise having an amplitude sufficient to be misinterpreted by a following stage for 2 ms following a high-to-low transition, and for 5 ms following a low-to-high transition, blanking interval circuit 22 should be arranged to provide blanking intervals of at least 2 ms and 5 ms, respectively (if blanking intervals of different durations are possible), or at least 5 ms (if only one blanking interval is possible).

Blanking interval circuit 22 may be implemented with a wide variety of different circuits. One possible implementation is simply a delay circuit which provides a delay from its input to its output. This could be accomplished with, for example, an R—C low pass filter. Adding inverters to buffer the filter's input and output would improve circuit performance, as would adding voltage hysteresis to improve the delay circuit's noise immunity. A series of inverters connected in series might also be used to provide a desired delay.

Note that the digital blanking circuit configuration shown in FIG. 2 is merely exemplary. For example, the LATCH and $\overline{\text{LATCH}}$ inputs of falling and rising edge latches 50 and 52 need not be complementary; the latches can be arranged to require signals of the same polarity to initiate a latch. As only one of the latches is to be enabled at any one time, this would require the addition of an inverter on one of the latch inputs, or for complementary control signals to be produced by blanking interval circuit 22. Circuit 22 might even be arranged to provide separate, coordinated control signals to the LATCH, $\overline{\text{LATCH}}$, and SELECT inputs.

Figure 5:
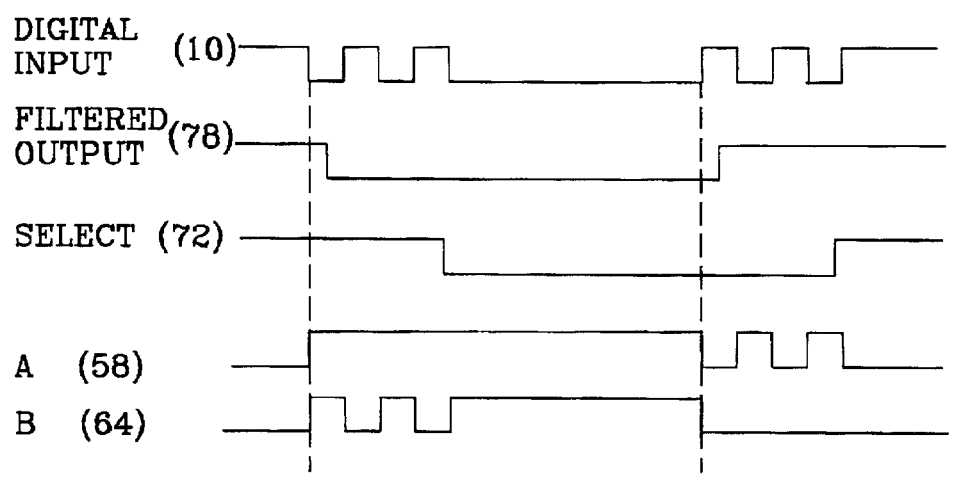
FIG. 5 is an exemplary timing diagram for the digital blanking circuit of FIG. 4.

As shown in FIG. 4, latches 50 and 52 are suitably implemented as SR latches, with the "$\overline{\text{set}}$" (S) input of latch 50 and the "reset" (R) input of latch 52 connected to latch inputs 56 and 62, respectively, and the "$\overline{\text{reset}}$" (R) input of latch 50 and the "set" (S) input of latch 52 serving as the LATCH and $\overline{\text{LATCH}}$ inputs 60 and 66, respectively. Falling edge latch 50 is made from two cross-coupled NAND gates G1 and G2, and rising edge latch 52 is made from two cross-coupled NOR gates G3 and G4. Each latch is inverting, such that the waveforms for outputs 58 and 64 (connected to MUX inputs A and B, respectively) are the inverse of those shown in FIG. 3; this is seen in the corresponding timing diagram shown in FIG. 5. Because the latches are inverting, an inverter 74 is connected to the output 26 of mux 54 to provide a FILTERED OUTPUT signal 78 of the proper polarity.

Note that the implementations of latches 50 and 52 shown in FIG. 4 are merely exemplary; many other possible circuits may be used to provide the latching functions required by the invention.

One possible embodiment of a digital blanking circuit which includes an adaptive input as described above is shown in FIG. 6. Here, the FILTERED OUTPUT 26 is only allowed to re-transition after the transition which triggered a blanking interval has propagated through a predefined signal path, which includes a following stage or stages (not shown) that toggle an output node in response to the propagating signal 10 transition. This results from automatically adjusting the blanking interval to have the same duration as the signal path delay. One way in which this may be accomplished is with the addition of an adaptive latch 100. Adaptive latch 100 has an input 102, which is connected to the output node at the end of the predefined signal path, an output 104, and a reset input 105. The digital blanking circuit can be arranged to be adaptive "on a falling edge", in which the blanking interval is not allowed to terminate until the occurrence of a high-to-low transition at adaptive input 102, "on a rising edge" (low-to-high transition at input 102 terminates blanking interval), or on either ("dual edge adaptive").

A blanking interval circuit 106 receives output 26 from multiplexer 54 and output 104 from adaptive latch 100 as inputs, and provides a SELECT signal 108 to latches 50, 52 and mux 54 in response. Blanking interval circuit 106 functions somewhat differently than was described in relation to FIG. 2. A blanking interval is still triggered by an appropriate transition on output 26 from multiplexer 54. Now, however, the termination of the blanking interval depends on the digital blanking circuit's configuration. If adaptive on a falling edge, adaptive latch 100 is arranged to latch a "0" upon receipt of a high-to-low transition at its input 102, and to toggle its output 104 to blanking interval circuit 106. In response, blanking interval circuit 106 terminates the blanking interval immediately thereafter. Note that, with the digital blanking circuit adaptive on a falling edge, a blanking interval triggered by a rising edge on digital input signal 10 is terminated in the conventional manner—after a predetermined time period.

Similarly, if the digital blanking circuit is adaptive on a rising edge, adaptive latch 100 latches a "1" and toggles its output 104 upon receipt of a low-to-high transition at its input 102, and blanking interval circuit 106 terminates the blanking interval immediately thereafter. If adaptive on either edge, adaptive latch 100 toggles its output 104 upon receipt of either a high-to-low or low-to-high transition, so that the blanking interval is immediately terminated upon the occurrence of either edge. The reset input 105 of adaptive latch 100 is preferably connected to SELECT signal 108, with latch 100 arranged to be reset from its latch mode when SELECT changes state.

Figure 6:
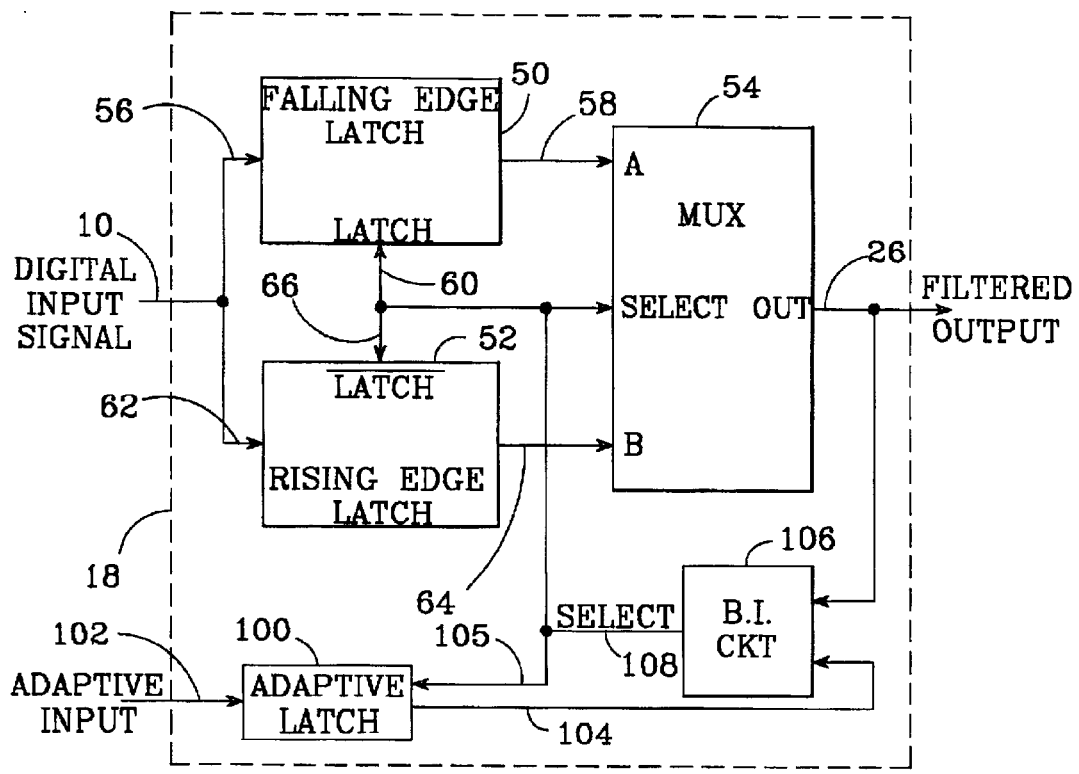
FIG. 6 is a block diagram of an embodiment of a digital blanking circuit which includes an adaptive latch.
Figure 7:
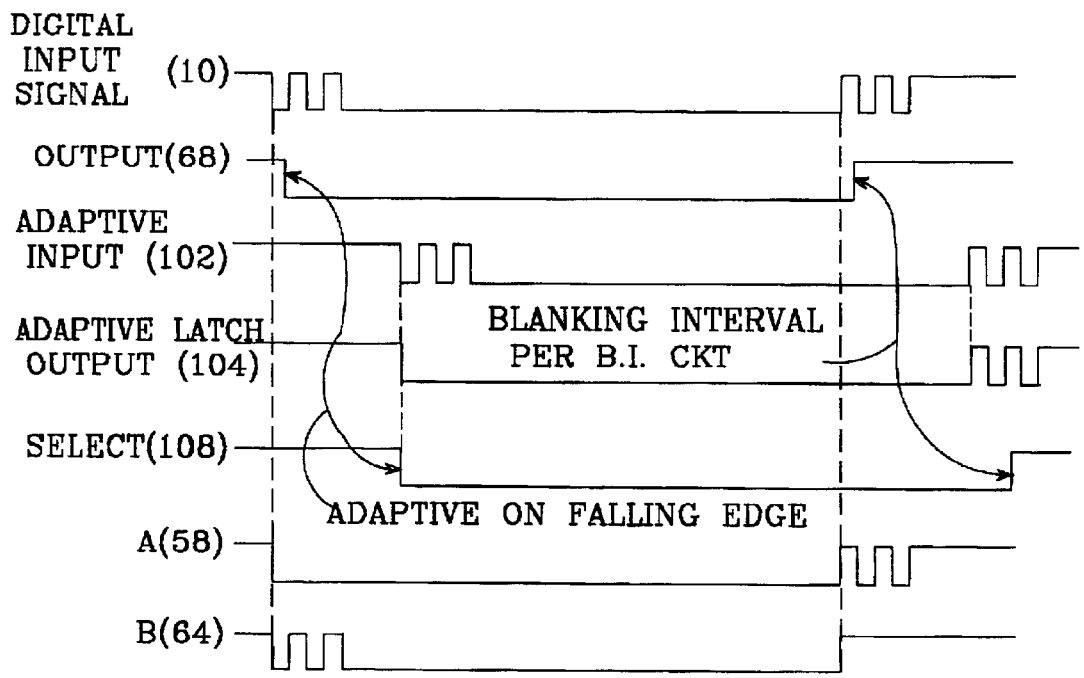
FIG. 7 is an exemplary timing diagram for the digital blanking circuit of FIG. 6.

A timing diagram depicting the operation of the circuit of FIG. 6, as configured to be adaptive on a falling edge, is shown in FIG. 7. Falling and rising edge latches 50 and 52 and multiplexer 54 operate as in FIG. 2: with the SELECT signal initially high, falling edge latch 50 will latch the next occurrence of a "0", the output of rising edge latch 52 tracks its input, and multiplexer 54 passes input A to its output 68. Thus, when signal 10 transitions from high-to-low, it is latched by falling edge latch 50, and the falling edge and the latched "0" are passed to output 26 via multiplexer 54.

As long as SELECT remains high, FILTERED OUTPUT will remain low, and thus the noise 12 present on signal 10 after its high-to-low transition is prevented from propagating to a following stage. Because the digital blanking circuit is adaptive on a falling edge, the SELECT signal will remain high until the falling edge propagates through the predefined signal path and is latched by adaptive latch 100, which causes blanking interval circuit 106 to pull the SELECT signal low, thereby ending the currently-running blanking interval.

The use of adaptive latch 100 also prevents noise present on adaptive input 102 from becoming troublesome. Because the adaptive latch latches on a high-to-low transition, noise that follows the transition is prevented from being passed on to blanking interval circuit 106.

With SELECT now low, the next low-to-high transition of digital input signal 10 causes rising edge latch 52 to latch a "1", which is propagated to FILTERED OUTPUT via multiplexer 54. This is detected by blanking interval circuit 106, which, because the digital blanking circuit is adaptive only on falling edges, begins timing a blanking interval. Depending on the duration of the blanking interval, it is possible that the digital input signal will propagate to the end of the signal path and through adaptive latch 100 before the blanking interval expires. Blanking interval circuit 106 is arranged to ignore this, however, and thus to keep SELECT low until the expiration of the blanking interval. When this occurs, SELECT goes high and the digital blanking circuit is again prepared to receive a falling edge.

As noted above, digital blanking circuit 18 can also be configured to be adaptive on a rising edge, or on either a rising or falling edge, as required by a particular application.

As a safety feature, blanking interval circuit 106 can include a timer which is triggered by falling edges (if adaptive on a falling edge) and which times out after a predetermined time period. Normally, for a falling edge, the blanking interval is terminated via the output 104 of the adaptive latch. However, if the adaptive latch never latches—because the adaptive input never toggled, for example—blanking interval circuit 106 is arranged to terminate the blanking interval when the timer times out.

An additional timer might also be connected in series with adaptive input 102. This additional timer can be used to extend the adaptive blanking period to cover any final stage settling or noise that might be present.

Figure 8:
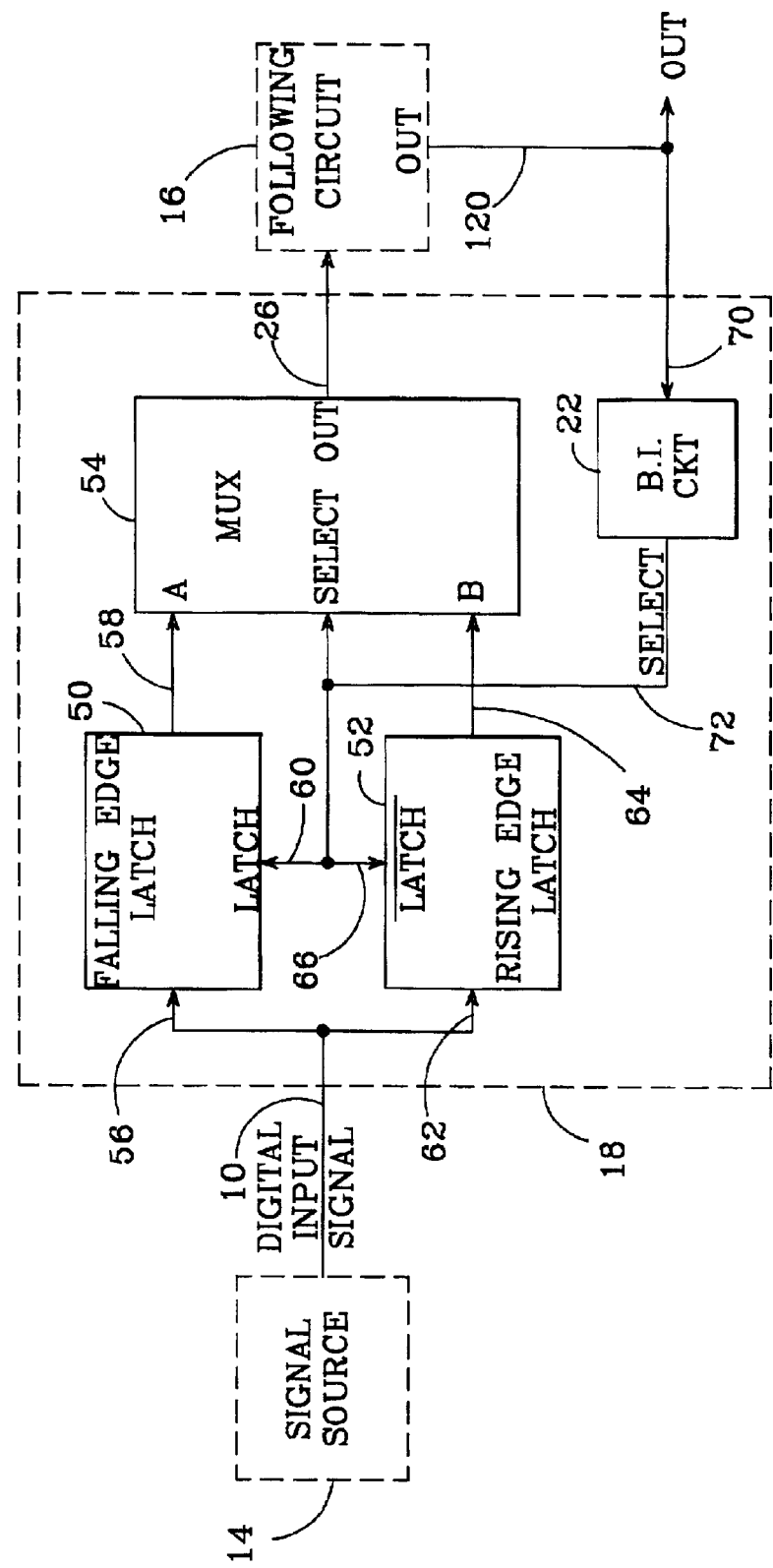
FIG. 8 is a block diagram of an adaptive digital blanking circuit as it might be employed in an overall system.

Another possible adaptive embodiment of a digital blanking circuit 18 in accordance with the present invention is shown in FIG. 8, which depicts digital blanking circuit 18 in the context of an overall system. As in FIG. 1, signal source 14 produces digital input signal 10, which is used by a following stage 16 to produce an output 120; in this example, output 120 is the output node at the end of a signal path taken by signal 10. This embodiment does away with the need for an adaptive latch by incorporating the propagation delay through following stage 16 into the digital blanking circuit. That is, rather than connect the input 70 of blanking interval circuit 22 to the output 26 of multiplexer 54, it is connected to the end of the signal path—i.e., to output 120.

This configuration makes the digital blanking circuit inherently adaptive, in that blanking interval circuit 22 can take no action until a transition occurs at its input 70, which cannot occur until the transition has propagated through the entire signal path. By making the delays through the following stage part of the digital blanking circuit, the delays introduced by blanking interval circuit 22—which would otherwise be chosen to mimic the system delays—can be made very short, or even eliminated altogether. Note that, though following stage 16 in FIG. 8 is shown as a single stage, the signal path for digital input 10 can, in fact, include a number of stages.

While particular embodiments of the invention have been shown and described, numerous variations and alternate embodiments will occur to those skilled in the art. Accordingly, it is intended that the invention be limited only in terms of the appended claims.

We claim:

1. A digital blanking circuit, comprising:
    an input connected to receive a digital input signal,
    an output,
    a rising edge latch which receives said digital input signal and a first select signal at respective inputs, said first select signal having first and second states, said rising edge latch arranged to produce an output which tracks said digital input signal when said first select signal is in its first state and latches said digital input signal upon the first occurrence of a low-to-high transition of said digital input signal after said first select signal transitions from its first state to its second state,
    a falling edge latch which receives said digital input signal and a second select signal at respective inputs, said second select signal having first and second states, said falling edge latch arranged to produce an output which tracks said digital input signal when said second select signal is in its first state and latches said digital input signal upon the first occurrence of a high-to-low transition of said digital input signal after said second select signal transitions from its first state to its second state, and
    a two-to-one multiplexer which receives the outputs of said rising and falling edge latches and a third select signal at respective inputs, said third select signal having first and second states, said multiplexer arranged to transfer the output of said rising edge latch to an output when said third select signal is in its first state and to transfer the output of said falling edge latch to said multiplexer output when said third select signal is in its second state, said multiplexer output being said digital blanking circuit output,
    a blanking interval circuit connected to receive said digital blanking circuit output at its input and arranged to trigger a blanking interval having a first duration upon the occurrence of a rising edge at its input, to trigger a blanking interval having a second duration upon the occurrence of a falling edge at its input, and to provide said first, second and third select signals such that said digital blanking circuit output is prevented from re-transitioning during a blanking interval.

2. The digital blanking circuit of claim 1, wherein said blanking interval circuit is arranged such that said first and second blanking interval durations are equal.

3. The digital blanking circuit of claim 1, wherein said blanking interval circuit is arranged such that said first and second blanking interval durations are different.

4. A digital blanking circuit, comprising:
    a rising edge latch which receives a digital input signal and a first select signal at respective inputs, said first select signal having first and second states, said rising edge latch arranged to produce an output which tracks said digital input signal when said first select signal is in its first state and latches said digital input signal upon the first occurrence of a low-to-high transition of said digital output signal after said first select signal transitions from its first state to its second state,
    a falling edge latch which receives said digital input signal and a second select signal at respective inputs, said second select signal having first and second states, said falling edge latch arranged to produce an output which tracks said digital input signal when said second select signal is in its first state and latches said digital input signal upon the first occurrence of a high-to-low transition of said digital output signal after said second select signal transitions from its first state to its second state, and
    a two-to-one multiplexer which receives the outputs of said rising and falling edge latches and a third select signal at respective inputs, said third select signal having first and second states, said multiplexer arranged to transfer the output of said rising edge latch to an output when said third select signal is in its first state and to transfer the output of said falling edge latch to said multiplexer output when said third select signal is in its second state, said multiplexer output being said digital blanking circuit output,
    a blanking interval circuit having an input connected to receive said digital blanking circuit output and arranged to trigger a blanking interval having a first duration upon the occurrence of a rising edge at its input, to trigger a blanking interval having a second duration upon the occurrence of a falling edge at its input, and to provide said first, second and third select signals such that said digital blanking circuit output is prevented from re-transitioning during a blanking interval.

5. The digital blanking circuit of claim 4, wherein said blanking interval circuit is arranged such that said first and second blanking interval durations are different.

6. The digital blanking circuit of claim 4, wherein said blanking interval circuit is arranged such that said first and second blanking interval durations are equal.

7. The digital blanking circuit of claim 4, wherein said blanking interval circuit is arranged to, upon the expiration of each of said blanking intervals triggered by a falling edge, provide said first, second, and third select signals such that said rising edge latch is set to latch, said falling edge latch is set to track, and said multiplexer is set to transfer said rising edge latch's output to said digital blanking circuit output, and upon the expiration of each of said blanking intervals triggered by a rising edge, to provide said first, second, and third select signals such that said falling edge latch is set to latch, said rising edge latch is set to track, and said multiplexer is set to transfer said falling edge latch's output to said digital blanking circuit output.

8. The digital blanking circuit of claim 4, wherein said rising edge latch comprises first and second two-input NOR gates, said first NOR gate connected to receive said digital input signal at one input and the output of said second NOR gate at its other output, said second NOR gate receiving the output of said first NOR gate at one input and said first select signal at its other input, the output of said first NOR gate being the output of said rising edge latch.

9. The digital blanking circuit of claim 4, wherein said falling edge latch comprises first and second two-input NAND gates, said first NAND gate connected to receive said digital input signal at one input and the output of said second NAND gate at its other output, said second NAND gate receiving the output of said first NAND gate at one input and said second select signal at its other input, the output of said first NAND gate being the output of said falling edge latch.

10. The digital blanking circuit of claim 4, wherein said rising edge latch comprises first and second two-input NOR gates, said first NOR gate connected to receive said digital input signal at one input and the output of said second NOR gate at its other output, said second NOR gate receiving the output of said first NOR gate at one input and said first select signal at its other input, the output of said first NOR gate being the output of said rising edge latch, said falling edge latch comprises first and second two-input NAND gates, said first NAND gate connected to receive said digital input signal at one input and the output of said second NAND gate at its other output, said second NAND gate receiving the output of said first NAND gate at one input and said second select signal at its other input, the output of said first NAND gate being the output of said falling edge latch, further comprising an inverter connected to the output of said multiplexer, the output of said inverter being the output of said digital blanking circuit.

* * * * *

UNITED STATES PATENT AND TRADEMARK OFFICE
CERTIFICATE OF CORRECTION

PATENT NO. : 6,961,396 B2  
DATED : November 1, 2005  
INVENTOR(S) : Jonathan M. Audy et al.

It is certified that error appears in the above-identified patent and that said Letters Patent is hereby corrected as shown below:

<u>Title page,</u>  
Item [54], Title, should read -- DIGITAL BLANKING CIRCUIT --.

<u>Column 5,</u>  
Line 6, change "(S)" to read -- $(\overline{S})$ --.

Signed and Sealed this

Second Day of May, 2006

JON W. DUDAS  
*Director of the United States Patent and Trademark Office*